US006570146B1

(12) United States Patent
Emery et al.

(10) Patent No.: US 6,570,146 B1
(45) Date of Patent: May 27, 2003

(54) SUBMERSIBLE SENSOR OUTPUT INVERTER

(75) Inventors: Keith E. G. Emery, San Diego, CA (US); George G Justice, Carlsbad, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/556,507

(22) Filed: Apr. 24, 2000

Related U.S. Application Data

(63) Continuation-in-part of application No. 09/219,659, filed on Dec. 23, 1998, now Pat. No. 6,077,125.

(51) Int. Cl.[7] ............................................. H01J 40/14
(52) U.S. Cl. ................... 250/214 R; 250/551
(58) Field of Search ............. 250/551, 214 R, 250/214.1, 214 LS, 214 SW; 327/514, 387

(56) References Cited

U.S. PATENT DOCUMENTS

| 2,502,658 | A | | 4/1950 | Lindmark |
| 4,520,429 | A | | 5/1985 | Hosking |
| 4,596,048 | A | * | 6/1986 | Dunki-Jacobs ............... 250/551 |
| 4,782,245 | A | | 11/1988 | Henry |
| 4,878,860 | A | | 11/1989 | Matsuoka |
| 5,276,443 | A | | 1/1994 | Gates et al. |

OTHER PUBLICATIONS vol. 34, 1995–1996 Buyer's Guide, By Daniel Woodhead, entitled "Your Worldwide Source for Quality Electrical Solutions", Month unknown.

* cited by examiner

Primary Examiner—Que T. Le

(57) ABSTRACT

A system for connecting NPN sensors to current sinking inputs of a controller, and connecting PNP sensors to current sourcing inputs of a controller. A sensor output inverter uses back-to-back optoisolators and a voltage divider to generate an output signal at ground voltage when a ten to thirty volt reference voltage is applied to the input, and an output signal at the reference voltage when a ground voltage is applied to the input. The inverter circuit is preferably overmolded or potted in an in-line package using industry-standard three-pin male and female DIN-style connectors as output and input connectors respectively. The reference voltage and ground voltage are supplied to the inverter via these connectors. The sensor output inverter can be connected to a mating termination block, either directly or via cordsets, to form a water-resistant, submersible, sensor termination system.

12 Claims, 14 Drawing Sheets

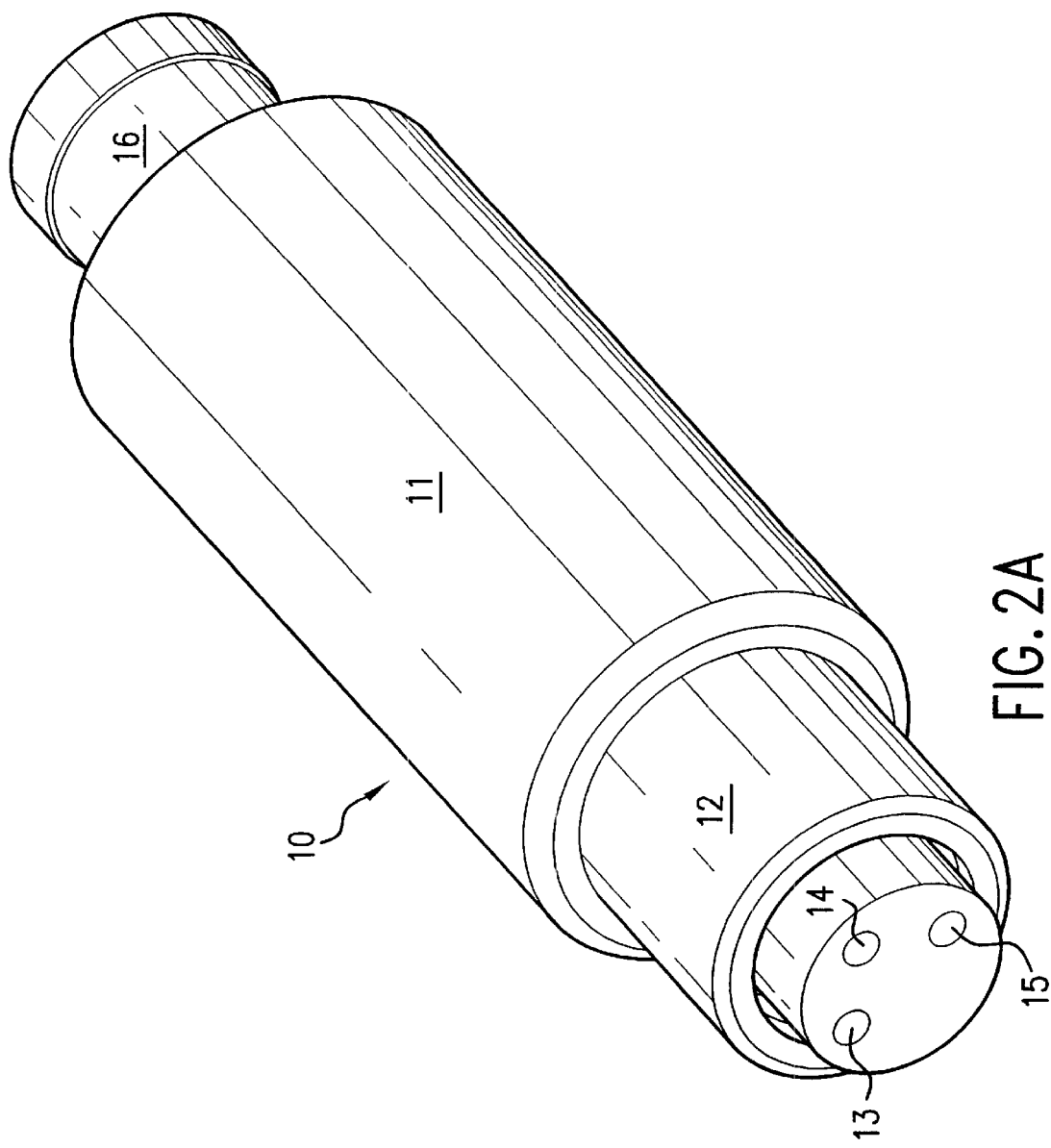

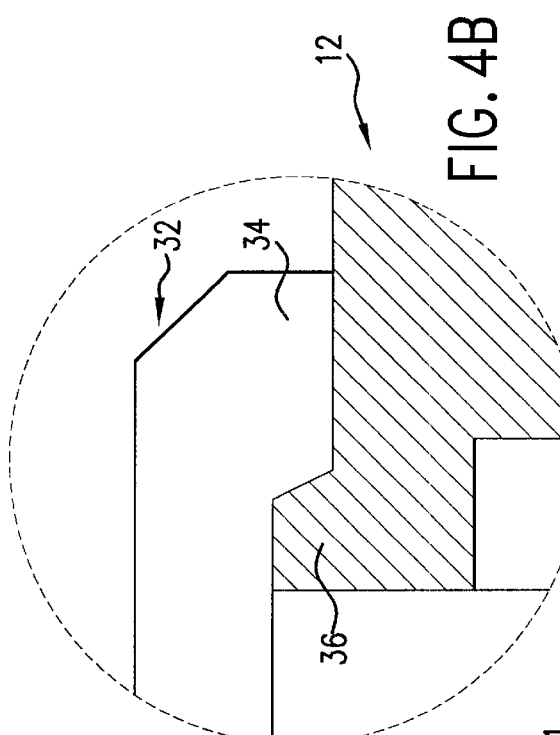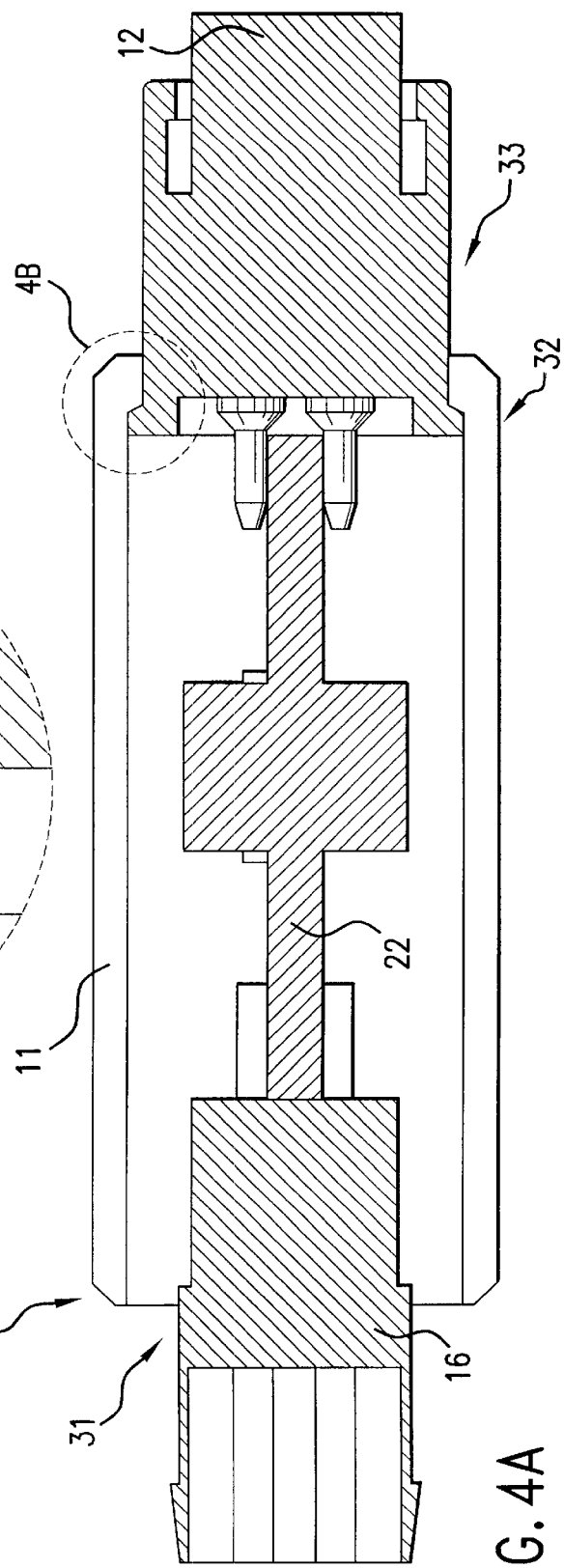

000000
SUBMERSIBLE SENSOR OUTPUT INVERTER

CROSS-REFERENCE TO RELATED APPLICATIONS

This application is a continuation-in-part of the co-pending U.S. application Ser. No. 09/219,659, by Emery, filed Dec. 23, 1998, titled "Versatile Input/Output Control and Power Distribution Block for Use With Automated Tooling" now U.S. Pat. No. 6,077,125. This application also relates to the subject matter disclosed in the co-pending U.S. application Ser. No. 09/556,768, by Emery, filed concurrently herewith, titled "Chainable I/O Termination Block System". All of these applications are assigned to the assignee of the present invention and are hereby incorporated by reference in their entirety.

FIELD OF THE INVENTION

The present invention relates generally to industrial controls, and pertains more particularly to robust, easy to configure, and water-resistant interconnecting devices for use with sensors.

BACKGROUND OF THE INVENTION

In industrial control systems, a programmable logic controller (PLC) or computer is often required to send output control signals to, and receive input sensor signals from, a number of input/output (I/O) points in the system. Typically the connection to each I/O point consists of three wires: a wire which carries a ground signal, a wire which carries a power signal, and a wire which carries an I/O signal which either is a control signal that is output from the controller to external circuitry, or a sensor signal from the external circuitry that is input to the controller.

The wiring interconnections from the I/O points to the PLC are typically made at a termination block. At the termination block, the ground signals and the power signals connected to the different I/O points are combined respectively. The termination block passes the control signals and the sensor signals to the programmable logic controller.

The three individual wires from each sensor or control, grouped together in a cable, have typically been connected to a terminator block using wire leads held in individual wire receptacles. However, this mechanical arrangement frequently results in the sensor cables being subject to repetitive motion. Over the course of time, this can result in the wires within the cables becoming intermittently or permanently defective. In addition, replacement of I/O cables with wire leads held in individual wire receptacles can be time consuming.

To alleviate this problem, some manufacturers have utilized I/O cables with connectors which can be plugged into a termination block. This has provided for an easier replacement of defective cables. However, existing termination systems which utilize these types of connectors typically cannot be used in an environment where water or other liquids can splash onto the termination block, much less in an environment requiring that the cables and termination block be submersed in water or other liquids.

In addition, sensors are typically designed to provide an output signal in one of two ways, either by sourcing or sinking current. A PNP sensor that sources current (for example, one that uses a PNP transistor for its output stage) can directly interface with a PLC input which sinks current, while an NPN sensor that sinks current (for example, one that uses an NPN transistor for its output stage) can directly interface with a PLC input which sources current. Since a PLC typically packages in a single I/O module a number of input lines all of which must operate in either a sourcing or a sinking mode, the I/O module can directly connect only with a group of sensors which are of the same type (either all NPN or all PNP respectively). If some sensors of the incompatible current type are to be connected to the same I/O module (eg. an NPN sensor to a sinking PLC input, or a PNP sensor to a sourcing PLC input), additional circuitry must be added, generally at the termination block, in order for the PLC to properly read the sensor output.

The most common additional circuitry consists of pull-up or pull-down resistors. These resistors are generally inexpensive, but they are difficult to wire to the termination block in a robust and reliable way, as is needed in most industrial environments. In addition, the PLC program which reads the sensor must invert the sense of the logic level. For example, if an NPN sensor is connected to a sinking PLC input using a pullup resistor, and the sensor generates a logic level "1" signal (corresponding to the sensor turning on), the PLC input will detect a logic level of "0", corresponding to the sensor being "off". Therefore, the PLC program will have to invert the signal and recognize it as a logical "1" instead. This undesirably adds to the complexity of the PLC program, and reduces the clarity of its logic. Also, discrete resistors wired to termination blocks are not splash-resistant or submersible.

Another type of additional circuitry that allows connecting mismatched sensor and PLC input types are solid-state relays. While solid-state relays do not require any logic sense inversion in the PLC program, they are more expensive than resistors. Typically they must be wired to the sensor and PLC input at the termination block using discrete wires; therefore, they do not form a splash-resistant or submersible connection to the system. In addition, skill in reading technical documentation is required to understand how to properly wire each particular type of solid-state relay into the system so that it operates in the desired manner.

Accordingly, what is still needed is an easy to use, intuitive, mechanically robust, and programmatically transparent solution for connecting NPN sensors to current sinking inputs of a programmable logic controller, and connecting PNP sensors to current sourcing inputs of a programmable logic controller. Such a solution would also be applicable in a wide variety of markets if it could be conveniently packaged in a manner that is splash-resistant or even allows the connections to be immersed in liquid.

SUMMARY OF THE INVENTION

In a preferred embodiment, the present invention provides a sensor output inverter that can be connected between a sensor and a controller in order to allow NPN sensors to be used with current sinking controller inputs, and PNP sensors to be used with current sourcing controller inputs. The inverter is preferably packaged in a mechanically robust, plug-together arrangement that provides a programmatically transparent connection of the sensor to the controller. The inverter has a first optoisolator with its collector connected to a reference voltage, and a second optoisolator with its emitter connected to a ground voltage. A voltage divider for biasing the optoisolators is connected between the reference and ground voltages, and a threshold voltage point of the divider is connected to the anode of the first optoisolator and the cathode of the second optoisolator. The preferred voltage divider has an 8.25 kilohms first resistor connected between the reference voltage and the threshold voltage point, and a 3.48 kilohms second resistor connected between the threshold voltage point and the ground voltage.

The signal input of the inverter is connected to the cathode of the first optoisolator and the anode of the second optoisolator, while the signal output is connected to the emitter of the first optoisolator and the collector of the second optoisolator. In operation, a signal input equal to the ground voltage produces a signal output equal to the reference voltage, and vice-versa. The inverter works with reference voltages of between ten volts and thirty volts; the preferred reference voltage is twenty-four volts. The preferred inverter has a female DIN-style input connector with a protruding beveled flange and pins for the reference voltage, ground voltage, and signal input, and a male DIN-style output connector with pins for the reference voltage, ground voltage, and signal output. When assembled, the input connector is located at one end of a housing, and the output connector at the other end of the housing. The electronic components are mounted on a printed circuit board which is mounted to and electrically connected to the input connector and the output connector. The board has a thickness such that it forms a good mechanical fit edgewise between the pins of the input connector and output connector, which are mounted in-line and facing in opposite directions, and the pins are preferably soldered to surface-mount contact pads on the printed circuit board. The housing has a first end with a first opening opposite an second end with a second opening. The first opening is sized to admit one connector, typically the female, while the second end has a reducing beveled lip which makes the second opening is smaller than the first opening such that the beveled lip engages the protruding beveled flange of the female connector when the inverter is assembled.

An alternate embodiment of the termination system includes a submersible termination block having a sealed housing having a number of sensor connectors and a data connector. Each sensor connector can mate with a sensor, a signal cable, or a sensor output inverter so as to form a splash-resistant and submersible seal. Each sensor connector has a recessed beveled flange which frictionally engages a mating connector having a single barbed flange so as to provide the seal. A data cable having a corresponding signal line for the signal lines in each of the sensor connectors makes a similar seal with the data connector. Since the sensor output inverter is typically potted or overmolded, and uses the same style connectors, a termination system including connected inverters is likewise submersible.

The present invention may also be implemented as a method for providing a sensor signal to a controller. A sensor output inverter is provided which has an inverter input and an inverter output that either both source current or both sink current. The inverter input is connected to a sensor having a sensor output which operates in the opposite manner (for example, if the inverter input and inverter output sink current, the sensor output sources current), and the inverter output is connected to a controller having a controller input which operates in the same manner as the sensor output (for example, the controller input sources current). Connecting the inverter between the sensor and the controller allows the two to operate together, even though they could not be directly connected to each other. The inverter input may be plugged directly into the sensor output, or a sensor cordset may be connected between the inverter input and the sensor output. The inverter output may be connected to the controller input by first connecting the inverter output to one of the sensor connectors on a termination block, and then connecting the data connector on the termination block to the controller; the inverter output may be plugged directly into the sensor connector, or a sensor cordset may be connected between the inverter output and the sensor connector.

Other aspects and advantages of the present invention will become apparent from the following detailed description, taken in conjunction with the accompanying drawings, which illustrate by way of example the principles of the invention.

BRIEF DESCRIPTION OF THE DRAWINGS

FIGS. 2A and 2B are perspective views of the sensor output inverter of FIG. 1.

FIGS. 4A and 4B are cross-sectional views of the sensor output inverter of FIG. 2 illustrating the housing to input connector mounting arrangement.

DESCRIPTION OF THE PREFERRED EMBODIMENT

Figure 1A:
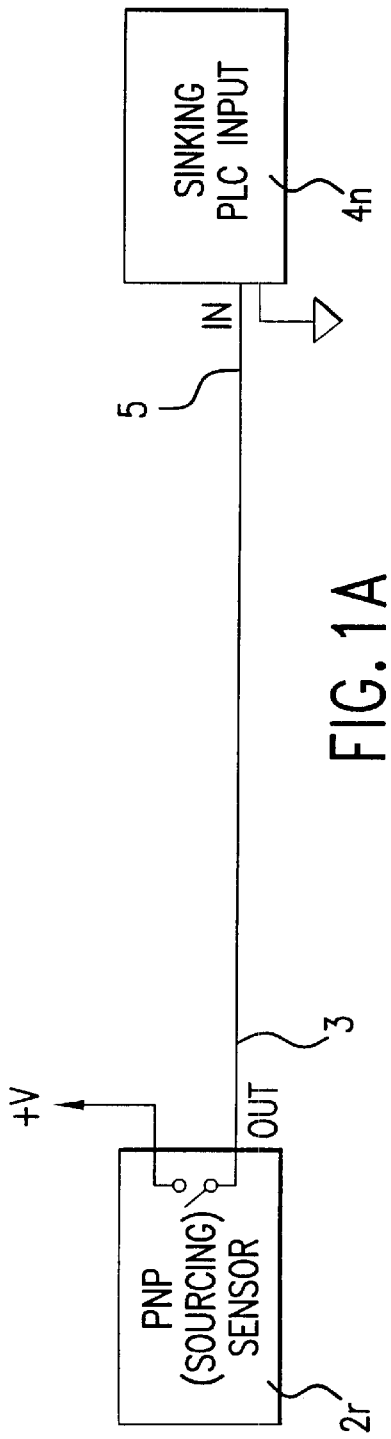
FIGS. 1A through 1D are schematic representations of interfacing sensors to controllers, including, where required, a sensor output inverter according to the present invention connected to the controller input.

Referring now to the drawings, there is illustrated a sensor output inverter 10 constructed in accordance with the present invention which provides a water-resistant, submersible electronic device for inverting the logic sense of a sensor signal. Sensors typically sense real-world conditions and provide an output signal indicating a binary condition with a logical value of "0" or "1". As is known to those skilled in the art, sensors use in their output stage either an open-collector transistor arrangement or a totem-pole transistor arrangement which functions as a switch. The transistor switch is turned on to indicate a "1", and off to indicate a "0". In order for a sensor to be directly connected to a controller, one must source current, while the other must sink current. As best understood with reference to FIG. 1A, in PNP sensor 2r one side of the transistor switch is connected to a reference voltage. When sensor 2r is set to a logic "1", this reference voltage is applied to the input of a sinking controller 4n, and the current sourced from the sensor 2r flows to ground through the sinking controller 4n input, the current flow causing the controller to detect a logic "1" state. When sensor 2r is set to a logic "0", virtually no current flows, causing the controller to detect a logic "0" state. Analogously, and as best understood with reference to FIG. 1B, in NPN sensor 2n one side of the transistor switch is connected to a ground voltage. When sensor 2n is set to a logic "1", the input of the sourcing controller 4r is pulled to ground, causing current sourced from the controller 4r to flow through the sensor 2n, the current flow causing the controller to detect a logic "1" state. When sensor 2n is set to a logic "0", virtually no current flows, causing the controller to detect a logic "0" state.

However, the output of an NPN (sinking) sensor 2n may not be directly connected to the input of a sinking controller 4n, and the output of a PNP (sourcing) sensor 2r may not be directly connected to the input of a sourcing controller 4r. As best illustrated with reference to FIGS. 1C and 1D, the inverter 10 can be advantageously used to interconnect sensors and controllers with mismatching interface circuits without resorting to wiring external circuitry such as resistors or relays into the system, and without having to reduce the clarity, or increase the complexity, of the controller program by inverting the sense of the programming logic. The inverter 10 interconnects sinking sensors to sinking controllers, and sourcing sensors to sourcing controllers, with a compact, simple-to-use, plug-together package. The inverter 10 according to the present invention is compatible with common sensor wiring and that can safely be used in wet or underwater environments, in a manner which is transparent to the controller programming.

Figure 2B:
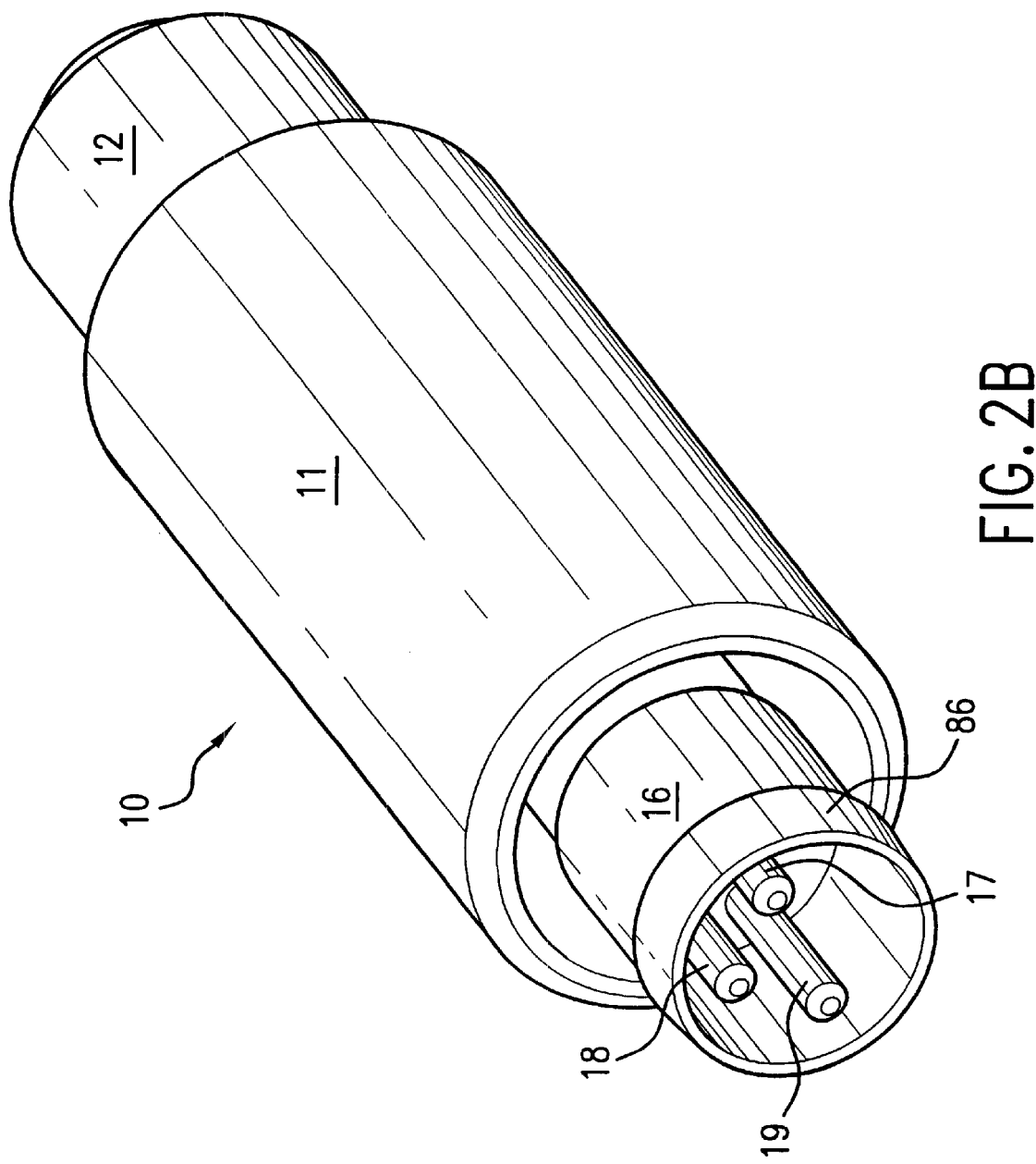

As best understood with reference to FIGS. 2A and 2B, a preferred embodiment of the inverter 10 has an input connector 12 having three input pins 13, 14, 15, and an output connector 16 having three output pins 17, 18, 19. Pins 13 and 17 are commonly-connected reference voltage pins which are maintained at a reference voltage between approximately ten volts and thirty volts from controller 4r, 4n when the output connector 16 is connected to controller 4r, 4n. Pins 15 and 19 are commonly-connected ground pins which are maintained at a ground voltage of approximately zero volts when the output connector 16 is connected to controller 4r, 4n. When the inverter 10 is also connected to a sensor 2r, 2n using input connector 12, the controller 4r, 4n provides the reference and ground voltages to the sensor 2r, 2n. Sensor 2r, 2n provides a signal indicating a binary condition, such as "on" or "off", which is transmitted to the inverter 10 on signal input pin 14. A signal equal to the reference voltage indicates one binary state, while a signal equal to the ground voltage indicates the other binary state. An inverting circuit 20 is connected between signal input pin 14 and signal output pin 18. The inverting circuit 20 produces an output voltage at the signal output 18 which is inverted from the voltage at the signal input 14. If signal input 14 is at the reference voltage, signal output 18 will be maintained at the ground voltage, and vice-versa.

Figure 3A:
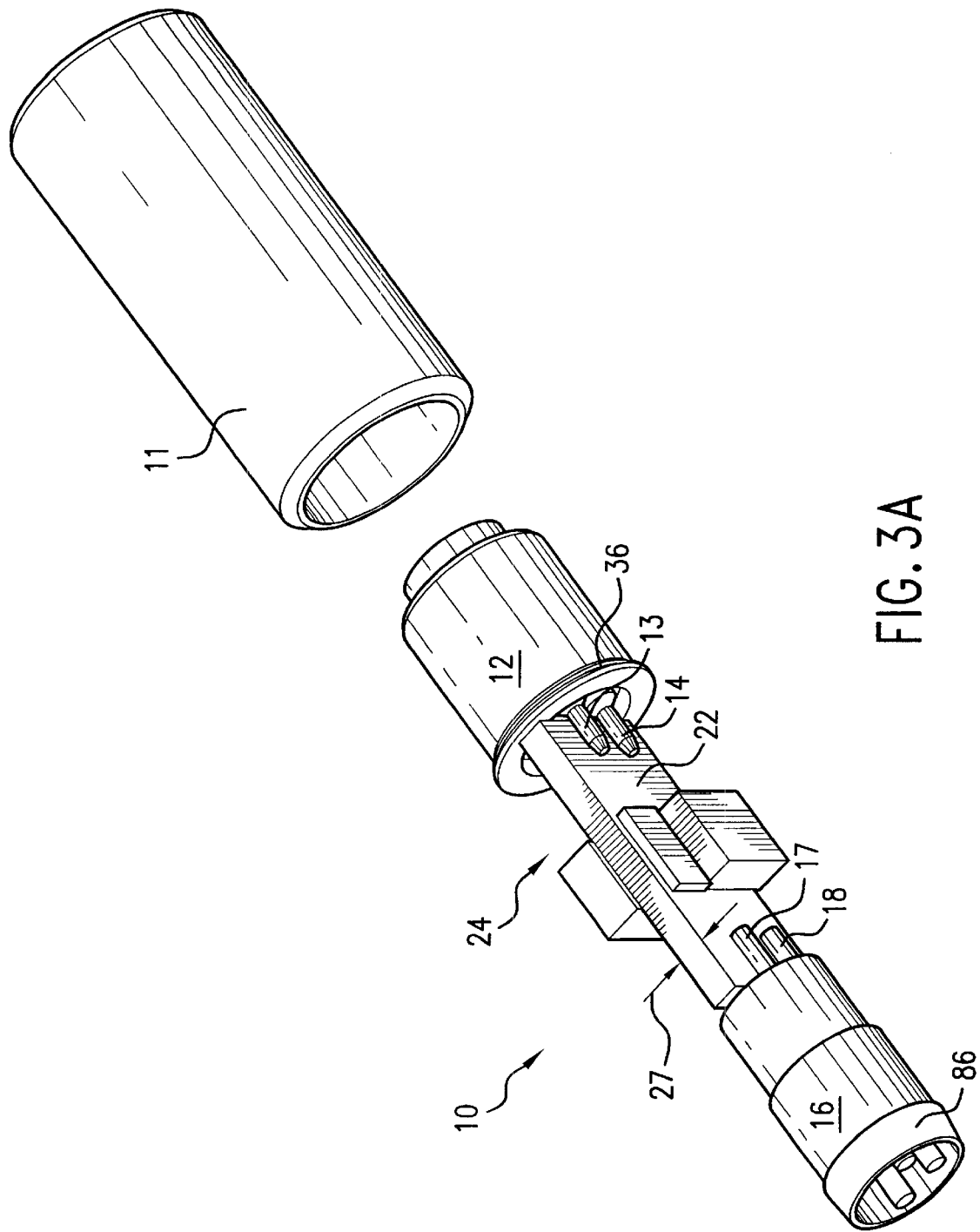
FIGS. 3A and 3B are perspective views of the sensor output inverter of FIG. 2 with the housing removed to show interior assembly details.
Figure 3B:
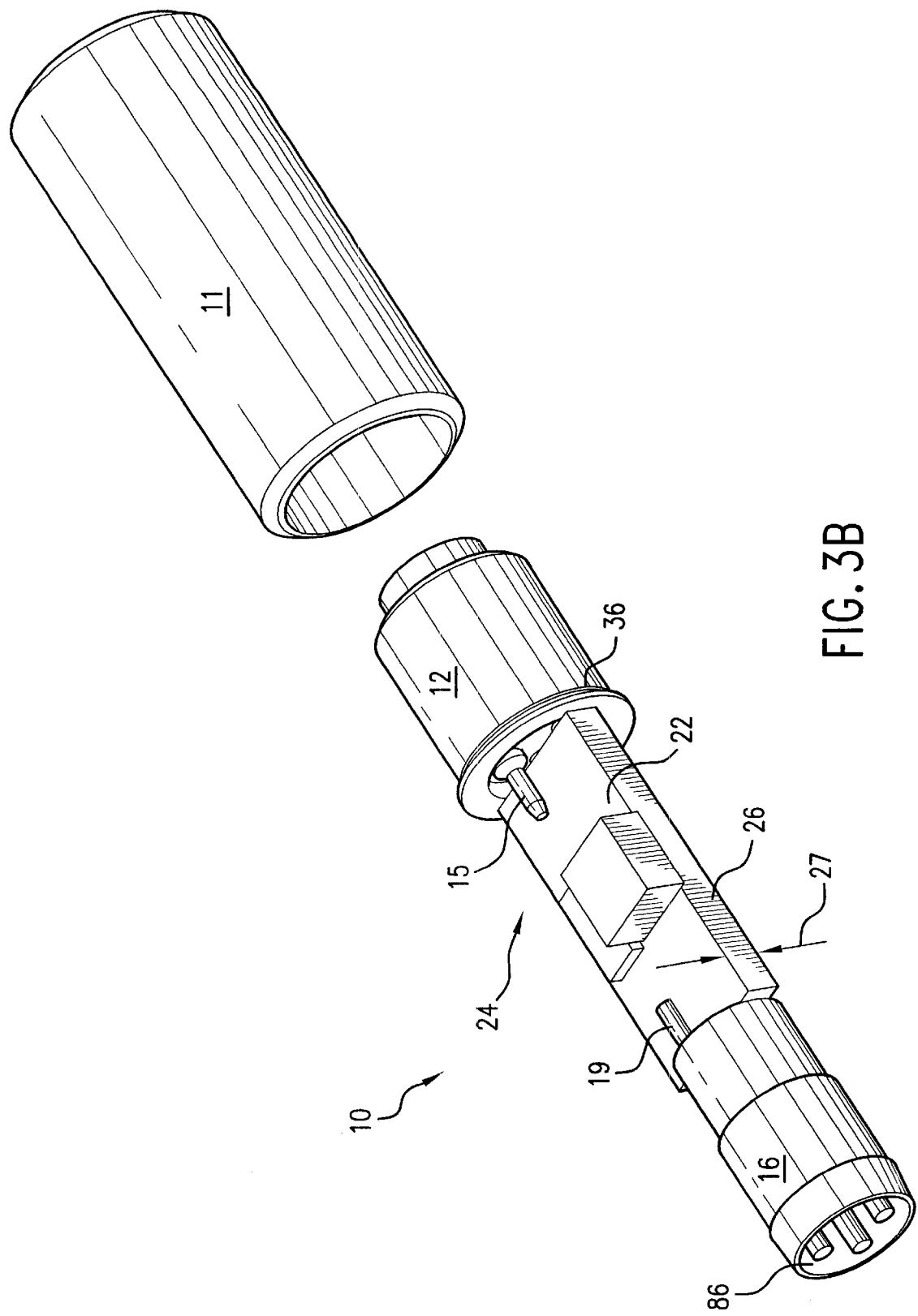

Considering now in further detail the mechanical arrangement of the inverter 10, and with further reference to FIGS. 3A and 3B, the preferred embodiment of the inverter 10 has an in-line housing 11 having the input connector 12 disposed at one end and the output connector 16 disposed at an opposite end of the housing 11. Connectors 12, 16 are preferably eight millimeter DIN connectors each having a different gender from the other; typically input connector 12 is female and output connector 16 is male. Since sensors typically have male connectors, using different genders for connectors 12, 16 helps to ensure that the inverter 10 is interconnected to the sensor and controller properly. As will be discussed subsequently in further detail, mated DIN connectors form a water-resistant connection that is splashproof and submersible. A printed circuit board (PCB) 22 containing the inverting circuit 20 is located within the housing 11. The connectors 12, 16 are mounted to the PCB 22 and the pins 13, 14, 15, 17, 18, 19 are electrically connected the inverting circuit 20. In the preferred embodiment, the PCB 22 is a surface-mount printed circuit board, and the pins 13, 14, 15, 17, 18, 19 are soldered to surface-mount contact pads on the PCB 22. In the preferred embodiment, the pins 13, 14, 15 extend from the rear surface of connector 12 and are parallel to each other and to the axis of connector 12, while the pins 17, 18, 19 extend from the rear surface of connector 16 and are parallel to each other and to the axis of connector 16. The arrangement of the three pins on connector 12 forms a mounting slot, indicated generally at 24, between two of the pins, such as pins 13, 14, and the third pin, such as pin 15, of connector 12. The PCB 22 has an edge 26 having a thickness 27 slightly less than the mounting slot height. The PCB 22 is edge-mounted between the mounting pins in the mounting slot 24 such that a good mechanical friction fit is formed between the PCB 22 and the mounting pins 13, 14, 15. Another end of the PCB 22 is similarly mounted between pins 17, 18, 19 of connector 16.

Considering now in further detail the assembly of the inverter 10, and as best understood with reference to FIGS. 4A–4B, the in-line housing 11 has a first end 30 with a first opening 31 opposite an second end 32 with a second opening 33. In the preferred embodiment, the first opening 31 is sized to admit the input connector 12. The second end 32 has a reducing beveled lip 34 located around the perimeter. The beveled lip 34 makes the second opening 33 is smaller than the first opening 31. The input connector 12 has a protruding beveled flange 36 disposed around the perimeter which engages the beveled lip 34 when the connector 12 is inserted into the housing 11 in a first direction 38. When the lip 34 and flange 36 are in contact, any further movement in the first direction 38 of the housing 11 relative to the connector 12 is prevented.

While the preferred embodiment has the flange 36 on the input connector 12, alternate embodiments could locate it on the output connector 16 instead. The housing 11 is dimensioned so as to completely cover the PCB 22 and partially cover the input and output connectors. Once the housing is in place, the connectors 12, 16, the inverting circuit 20, and the housing 11 are preferably potted or overmolded, which also makes a water-resistant inverter 10 that is splashproof and submersible when used with mating DIN connectors on, for example, a cordset.

Figure 5:
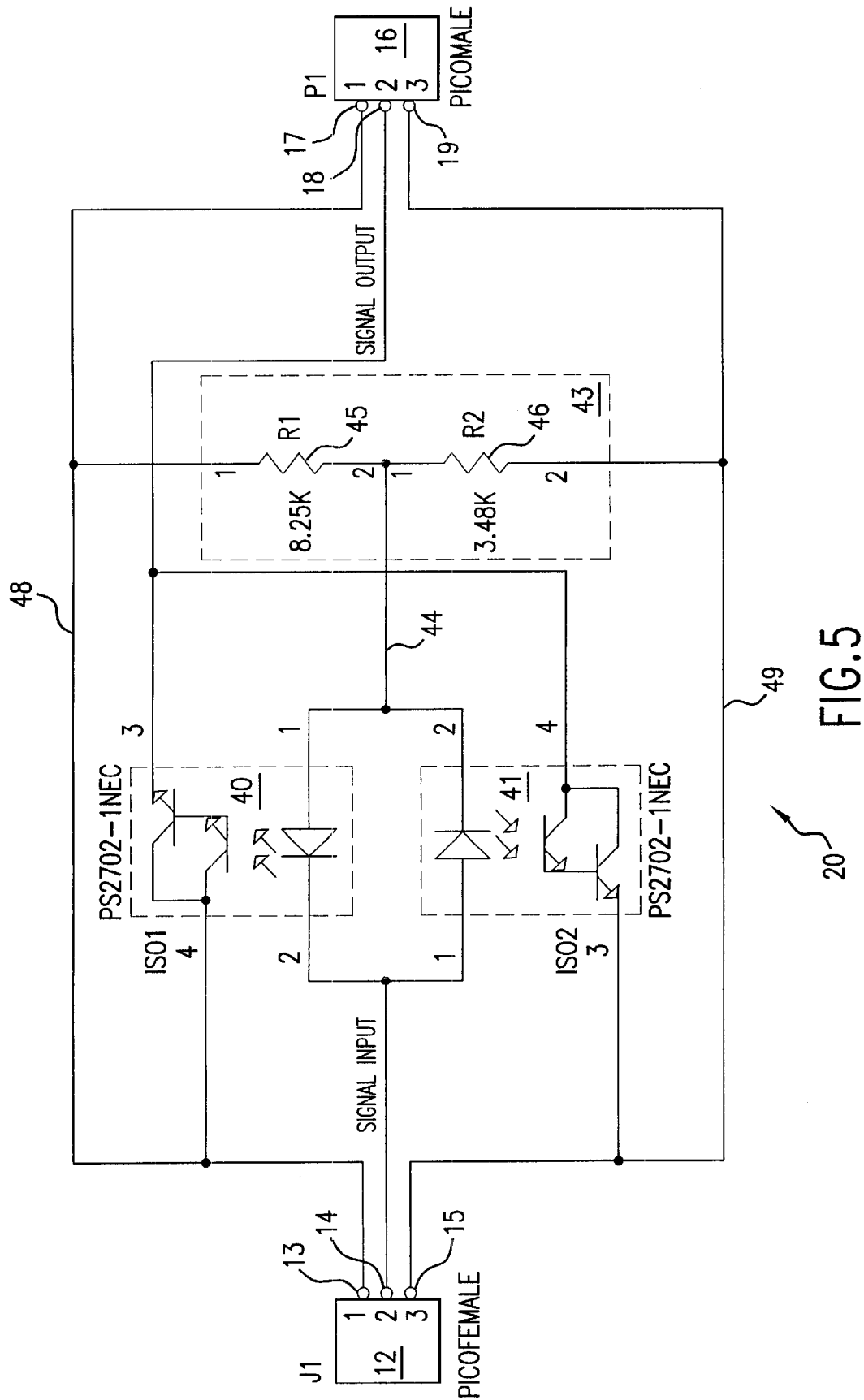
FIG. 5 is an electrical schematic diagram of the inverting circuit of the sensor output inverter of FIG. 2.

Considering now the inverting circuit 20 of the preferred embodiment, and with reference to FIG. 5, the inverting circuit 20 includes two optoisolators 40, 41 (also known as optical isolators, optocouplers, or photoisolators). Each optocoupler has external leads connected to an anode and a cathode of the embedded photodiode, and a collector and an emitter of an open-collector output transistor array. The operation of optoisolators is well known to those skilled in the art. Pin 13 of input connector 12 is electrically connected to pin 17 of output connector 16 by reference line 48; during operation this line 48 is maintained at the reference voltage. The preferred embodiment of the invention functions properly with any reference voltage between ten volts and thirty volts. The reference voltage is generally selected to match the voltage requirements of the attached sensor. Typical sensors operate on twenty-four volts. Pin 15 of input connector 12 is electrically connected to pin 19 of output connector 16 by ground line 49; during operation this line 49 is maintained at the ground voltage. The collector of optoisolator 40 is connected to the reference line 48, and the emitter of optoisolator 41 is connected to the ground line 49. The signal input 14 is commonly connected to the cathode of optoisolator 40 and the anode of optoisolator 41. A voltage divider 43 is connected between reference line 48 and ground line 49, and has a threshold voltage point 44 which is connected to the anode of optoisolator 40 and the cathode of optoisolator 41. The threshold voltage at threshold voltage point 44 is set to a value between the reference voltage and the ground voltage. In the preferred embodiment, the voltage divider 43 has resistor R1 45 connected between reference line 48 and threshold voltage point 44, and resistor R2 46 connected between threshold voltage point 44 and ground line 49. The signal output 18 is commonly connected to the emitter of optoisolator 40 and the collector of optoisolator 41. The preferred value for resistor R1 45 is 8.25 kilohms and the preferred value for resistor R2 46 is 3.48 kilohms. The preferred resistor values allow the inverter 10 to operate reliably with a wide variety of sensors despite the leakage currents that are produced in the "off" state by these sensors (in the "off" state of an ideal sensor, zero current would flow through the inverter 10).

In operation, the function performed by the inverting circuit 20 is to invert the logic sense of the sensor signal such that, if the voltage applied to the signal input 14 is approximately equal to the ground voltage, the voltage produced at the signal output 18 will be approximately equal to the reference voltage. Conversely, if the voltage applied to the signal input 14 is approximately equal to the reference voltage, the voltage produced at the signal output 18 will be approximately equal to the ground voltage. Considering first the case of applying a ground voltage to the signal input 14, the photodiode of optoisolator 40 will be forward-biased and the photodiode of optoisolator 41 reverse-biased since the threshold voltage at point 44 is higher than ground voltage. The output transistor array of optoisolator 40 will thus turn on, while the output transistor array of optoisolator 41 will turn off. As a result, the reference voltage will be applied to the signal output 18. Considering next the case of applying a reference voltage to the signal input 14, the photodiode of optoisolator 40 will be reverse-biased and the photodiode of optoisolator 41 forward-biased since the reference voltage is higher than the threshold voltage at point 44. The output transistor array of optoisolator 40 will thus turn off, while the output transistor array of optoisolator 41 will turn on. As a result, the ground voltage will be applied to the signal output 18.

Figure 1C:
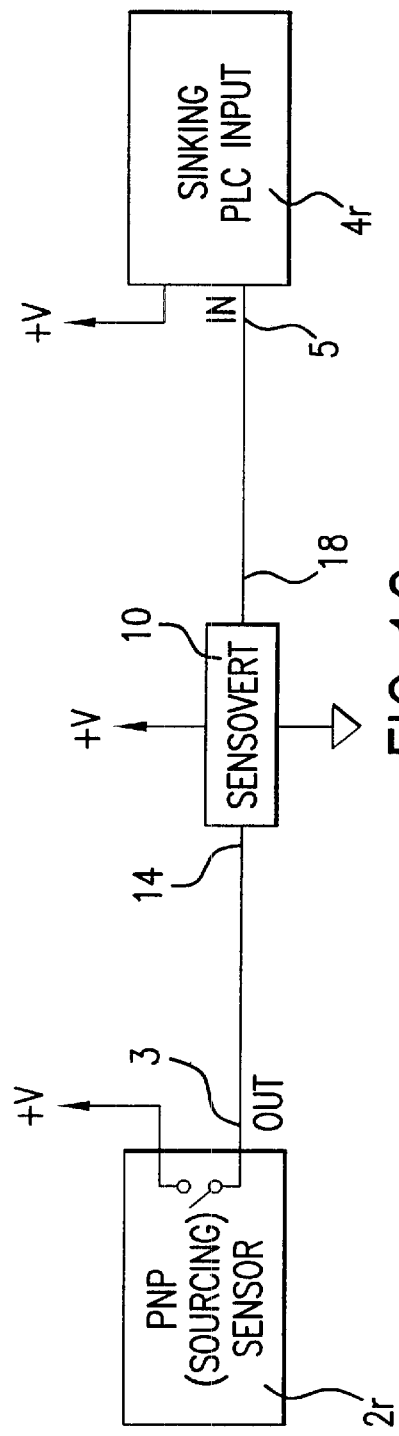
Figure 1B:
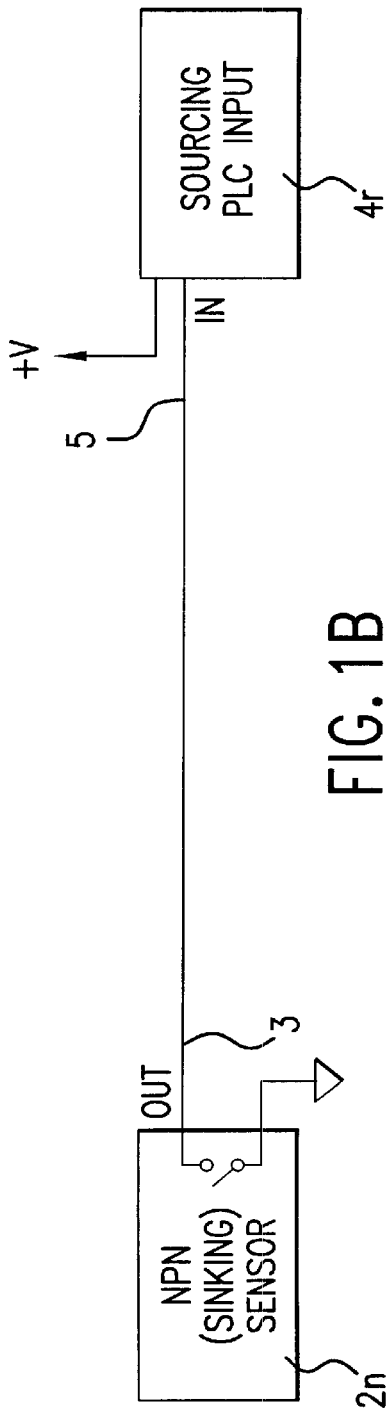

Considering now the above-described operation of the inverter 10 when connected between a PNP (sourcing) sensor 2r and a sourcing controller input 4r, and as best understood with reference to FIG. 1C, when sensor 2r is set to a logic "1", the reference voltage is applied to the signal input 14 of the inverter 10. This causes a ground voltage to be produced at the signal output 18 of inverter 10, which in turn results in current flowing from the sourcing controller 4r to ground through the inverter 10, causing the controller to detect the corresponding logic "1" state. The inverter 10 can sink up to 100 milliamps of current when operating in this configuration. When sensor 2r is set to a logic "0", either ground voltage is applied to the signal input 14 of the inverter 10, or the signal input 14 is left in a floating state. This causes a reference voltage to be produced at the signal output 18 of inverter 10, which in turn inhibits current flowing from the sourcing controller 4r to the inverter 10, causing the controller 4r to detect the corresponding logic "0" state.

Figure 1D:
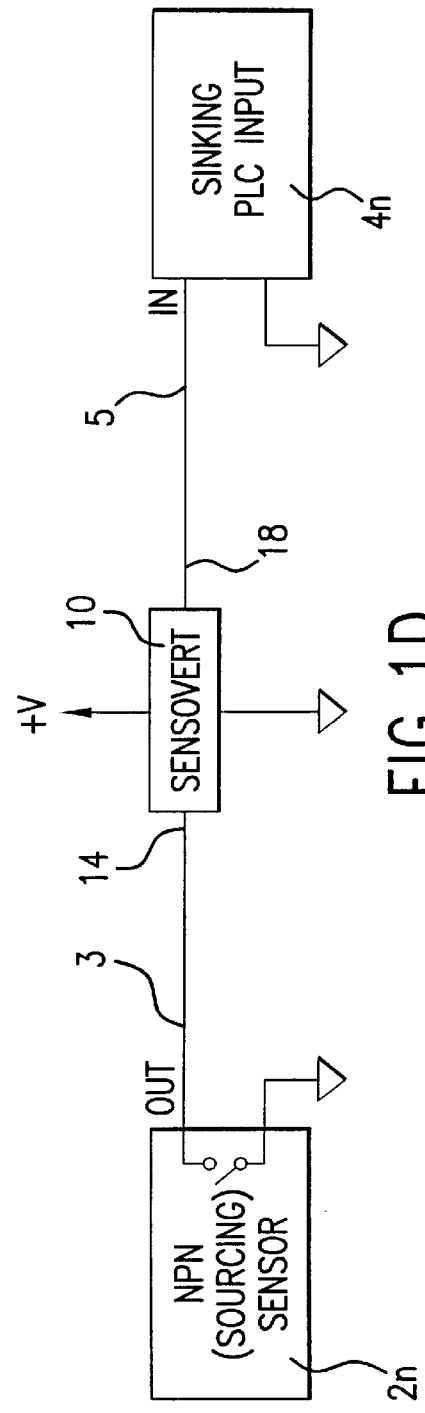

Considering in turn the operation of the inverter 10 when connected between an NPN (sinking) sensor 2n and a sinking controller input 4n, and as best understood with reference to FIG. 1D, when sensor 2n is set to a logic "1", the ground voltage is applied to the signal input 14 of the inverter 10. This causes a reference voltage to be produced at the signal output 18 of inverter 10, which in turn results in current flowing from the inverter 10 through the sinking controller 4n to ground, causing the controller to detect the corresponding logic "1" state. The inverter 10 can source up to 100 milliamps of current when operating in this configuration. When sensor 2n is set to a logic "0", either reference voltage is applied to the signal input 14 of the inverter 10, or the signal input 14 is left in a floating state. This causes a ground voltage to be produced at the signal output 18 of inverter 10, which in turn inhibits current flowing from the inverter 10 to the sinking controller 4n, causing the controller 4n to detect the corresponding logic "0" state.

Figure 6:
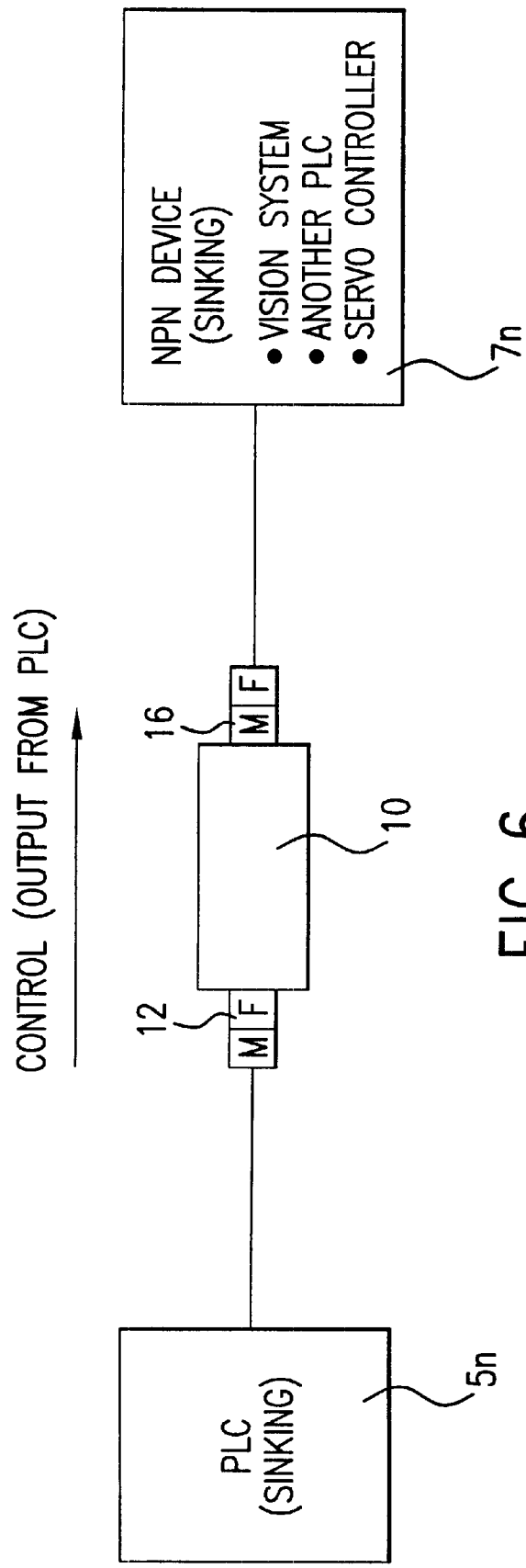
FIG. 6 is a schematic representation of the use of the sensor output inverter of FIG. 2 connected to a controller output rather than a controller input.

While the inverter 10 is typically used to connect a controller 4n input to a sensor 2n output as in FIGS. 1A–1D, the inverter 10 can also be used, as best understood with reference to FIG. 6, to connect a controller 5n output to the control input of another device 7n such as, for example, a vision system, a servo controller, or a programmable logic controller.

Figure 7:
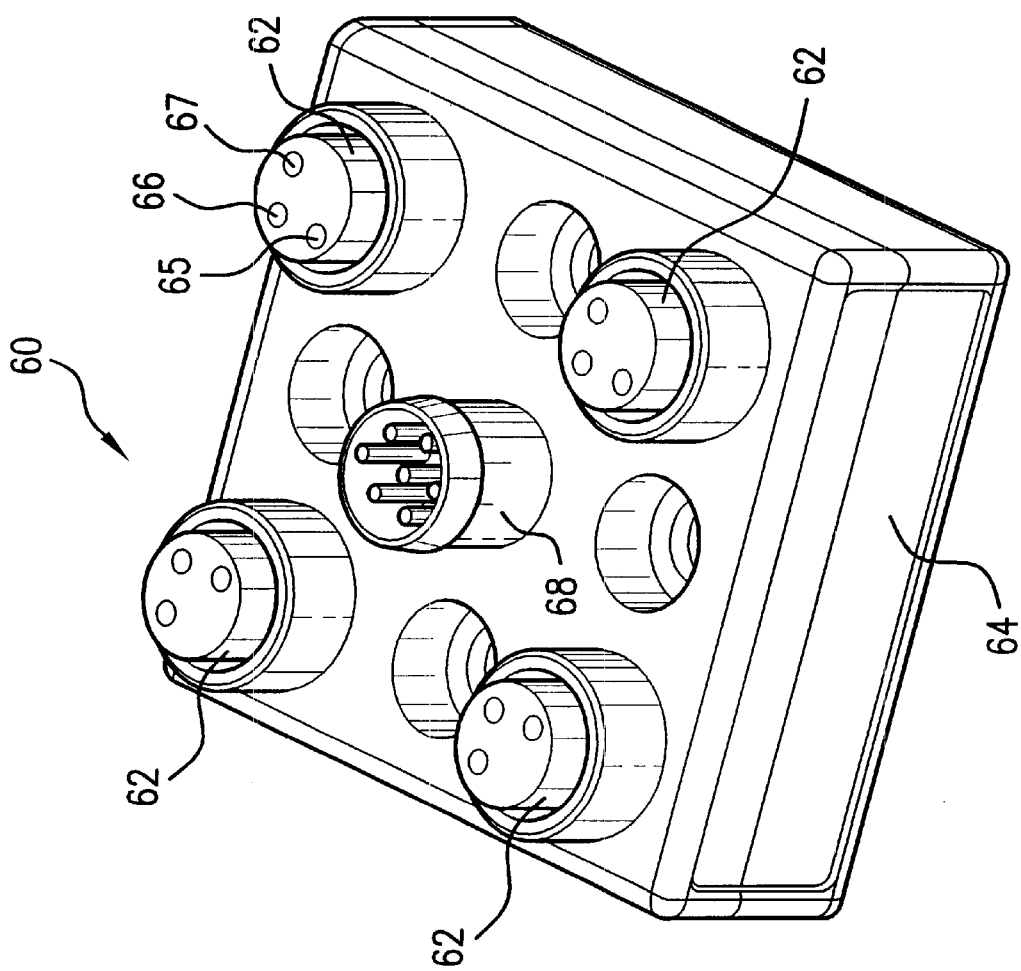
FIG. 7 is a perspective view of a submersible termination block according to the present invention which is usable with the sensor output inverter of FIG. 2.
Figure 8:
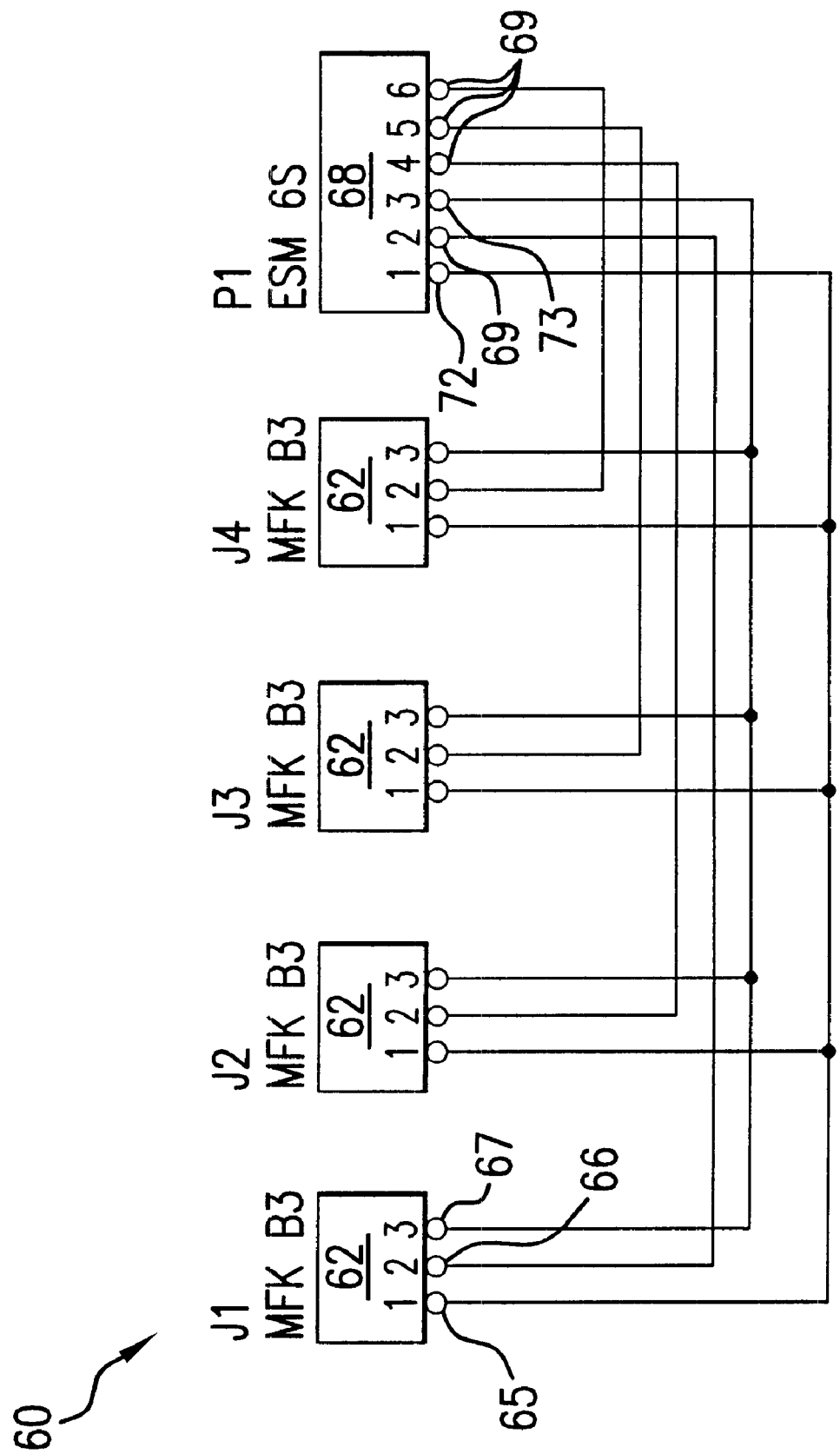
FIG. 8 is an electrical schematic diagram of the submersible termination block of FIG. 7.
Figure 9:
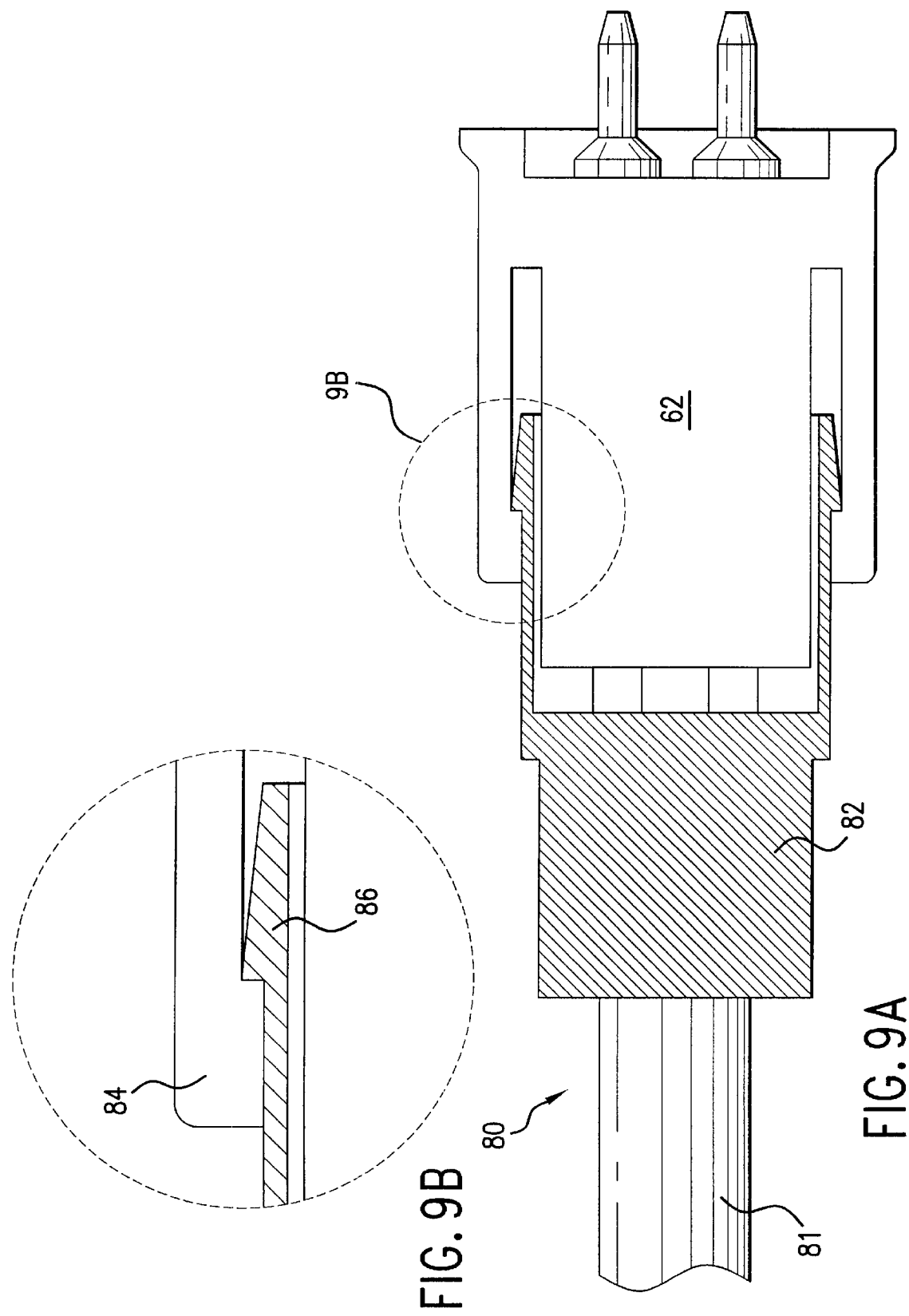
FIGS. 9A and 9B are cross-sectional views showing the water-resistant, submersible connection between a cordset and a connector mounted to the submersible termination block of FIG. 7.
Figure 10:
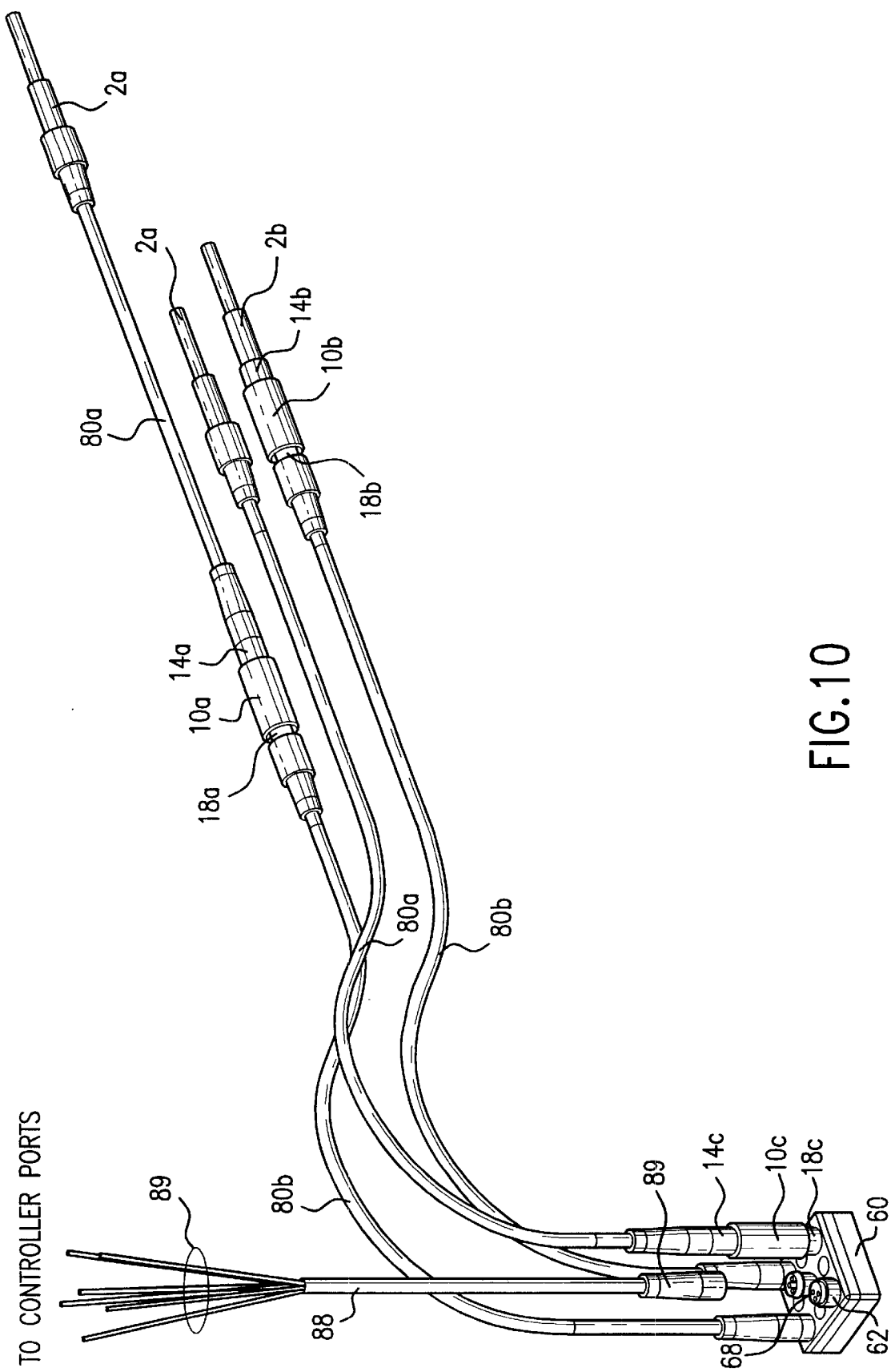
FIG. 10 is a schematic representation of example submersible system configurations of the inverters of FIG. 2, the termination block of FIG. 7, and compatible cordsets.
Figure 11:
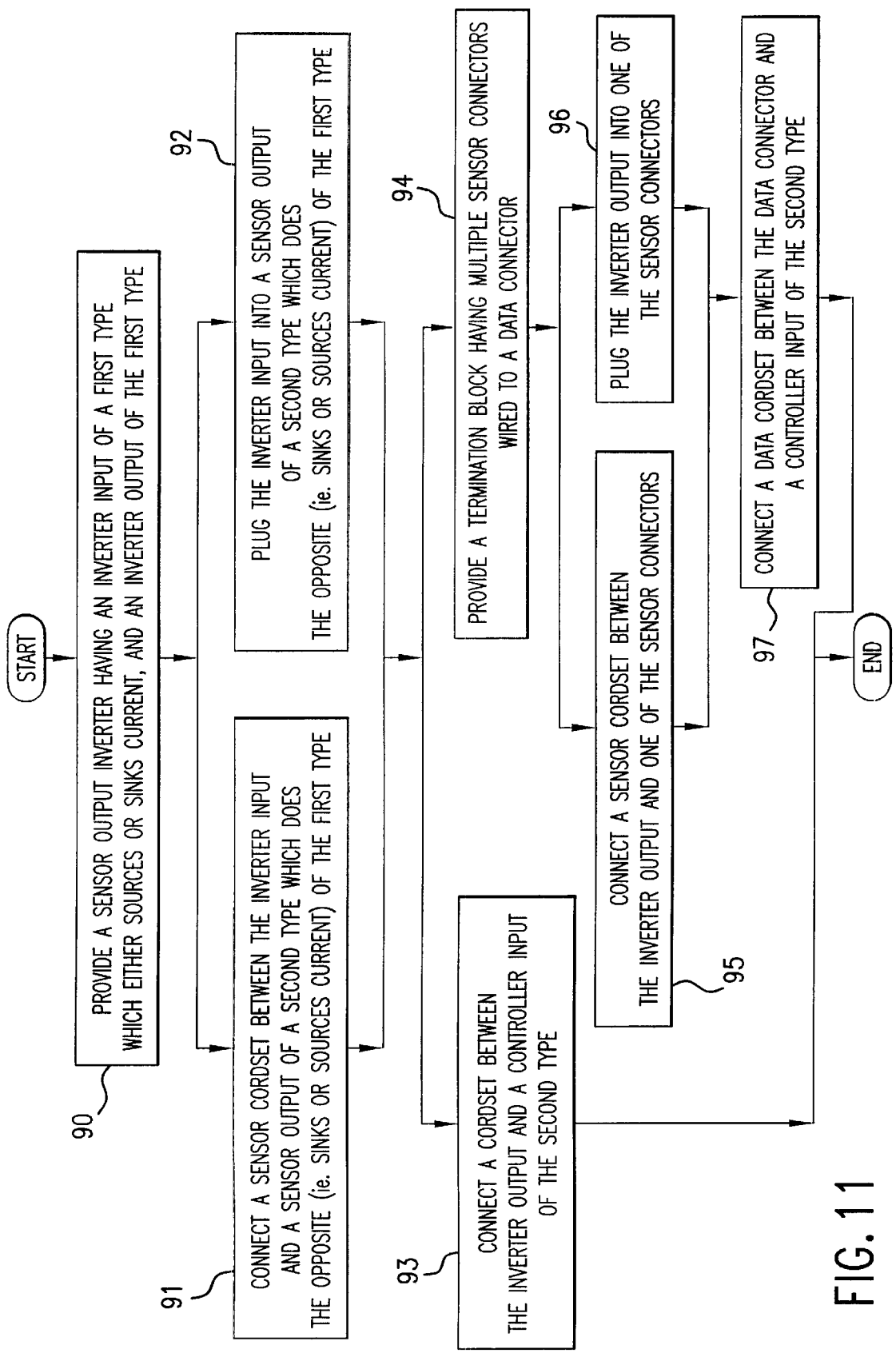
FIG. 11 is a flowchart of method of providing a sensor signal to a controller according to the present invention using the inverters of FIG. 2, the termination block of FIG. 7, and compatible cordsets.

Another embodiment of the present invention, as best understood with reference to FIGS. 7 and 8, is a submersible termination block 60 usable to couple a number of sensors, with or without inverters 10, to a controller 4. The termination block 60 has multiple sensor connectors 62 mounted to a housing 64. The sensor connectors are typically DIN connectors of the same type as used with inverter 10. Each sensor connector 62 is adapted to connect to devices such as a sensor 2n, 2r, a signal cable or cordset, and an inverter 10. Each sensor connector 62 has a reference voltage input pin 65, a signal input pin 66, and a ground voltage input pin 67. The termination block 60 also has a data connector 68 mounted to the housing 64 and adapted to mate with a data cable or cordset. The data connector 68 has a signal output pin 69 for each sensor connector 62, at least one reference voltage output pin 72, and at least one ground voltage output pin 73. Each signal output pin 69 is connected to a different one of the signal input pins 66. The reference voltage output pin 72 is commonly connected to each of the reference voltage input pins 65, and the ground voltage output pin 73 is commonly connected to each of the ground voltage input pins 67. The termination block 60 is preferably potted or overmolded so as to form a water-resistant seal such that the termination block 60 is splashproof and can be submersed after external connections are made to each connector 62, 68. The external connections typically are made by cordsets which, as best understood with reference to FIGS. 9A and 9B which illustrate a cordset 80 coupled to a sensor connector 62, can be plugged into the termination block 60 to form a water-resistant and submersible connection. A cordset 80 typically includes a cable 81 with an attached mating connector 82 of the same type (typically a DIN connector) but the opposite gender as sensor connector 62. Each sensor connector 62 has a recessed beveled flange 84 which can be frictionally engaged with a single barbed flange 86 of the mating connector 82. Either the beveled flange 84, the barbed flange 86, or both are deflectable so as to allow the connection to be made with a lesser amount of force, but requiring a greater amount of force to disconnect the mating connector 82 from the sensor connector 62. The frictional connection is water-resistant and submersible. A similar cordset 88 includes a connector 89 for mating with the data connector 68 of the termination block; however, the data connector 68 preferably has the opposite gender from sensor connector 62, while the connector 89 has the opposite gender from the mating connector 82. Although the above water-resistant submersible connection has been illustrated with regard to connections to the termination block 60, connectors having the same recessed beveled flange and barbed flange arrangement are preferably used for the input connector 12 and output connector 16 of the inverter 10 such that inverters 10 can be connected with cordsets 80 or a termination block 60 to likewise form water-resistant submersible connections.

As best understood with reference to FIGS. 1C–1D, 10 and 11, the present invention can also be implemented as a method for providing a signal 3 from a sensor 2n, 2r to the input 5 of a controller 4n, 4r by interconnecting inverters 10, termination blocks 60, and cordsets 80a–b, 88 according to the present invention. At 90, a sensor output inverter 10 is provided. As previously described herein, the inverter 10 will either source current at both its input 14 and output 18, or sink current at both its input 14 and output 18, depending on the type and state of the output signal 3 from the sensor 2n, 2r to which it is connected. If a PNP (sourcing) sensor 2r is connected to the inverter input 14, then when the sensor output 3 is sourcing current in its "on" state, the inverter input 14 and output 18 will both sink current. This allows current to be sourced from the input 5 of the sourcing controller 4r, thus causing the controller to detect the "on" state. If an NPN (sinking) sensor 2n is connected to the inverter input 14, then when the sensor output 3 is sinking current in its "on" state, the inverter input 14 and output 18 will both source current. This allows current to be sunk at the input 5 of the sinking controller 4n, thus causing the controller to detect the "on" state. During the "off" state of either type of sensor 2r, 2n, essentially zero current flows through the inverter input 14 and output 18 (reference the previous discussion herein of leakage currents), and thus the controller will detect the "off" state. At 91, a sensor cordset 80a is connected between the inverter input 14a and a sensor output of a sensor 2a which is either a PNP (sourcing) sensor or an NPN (sinking) sensor. Alternatively, at 92, the inverter input 14b is directly plugged into the sensor output of sensor 2b. Considering now the inverter output connection, at 93 a cordset is connected between the inverter output and a controller input of the same type (sourcing or sinking) as the sensor, and the method is concluded. At 94, an alternative approach uses a termination block 60 with multiple sensor connectors 62 to connect multiple sensors to the controller. Internal wiring in the block 60 routes the signals from the individual connectors 62 to individual pins of data connector 68. At 95, a sensor cordset 80b is connected between the inverter output 18 and one of the sensor connectors 62. Alternatively, at 96, the inverter output 18c is plugged directly into one of the sensor connectors 62. Finally, at 97, a data cordset 88, typically having flying leads 89, is connected between the data connector 68 and a controller input of the same type (sourcing or sinking) as the sensor, and the method is concluded.

From the foregoing it will be appreciated that the sensor output invertor and methods provided by the present invention represent a significant advance in the art. Although several specific embodiments of the invention have been described and illustrated, the invention is not limited to the specific methods, forms, or arrangements of parts so described and illustrated. In particular, while the present invention has been described with reference to sensors that have open-collector transistor output stages, the invention is not limited to operating with this type of sensor, but also operates with sensors that have totem-pole transistor output stages. The present invention also has application beyond the field of automated tooling, and may be used, for instance, in general purpose data acquisition systems and in automated electronic test equipment. The invention is limited only by the claims.

What is claimed is:

1. A sensor output inverter, comprising:
   an input connector having;
     a reference input adapted to receive a reference voltage between approximately ten volts and thirty volts,
     a ground input adapted to receive a ground voltage of approximately zero volts, and
     a signal input adapted to receive an input voltage selected from the group consisting of the reference voltage and the ground voltage;
   an output connector having;
     a reference output connected to the reference input,
     a ground output connected to the ground input, and
     a signal output; and
   an inverting circuit connected between the signal input and the signal output, the circuit producing an output voltage at the signal output which is inverted from the signal input voltage.

2. The sensor output inverter of claim 1, further comprising:
   an in-line housing having the input connector disposed at one end and the output connector disposed at an opposite end.

3. The sensor output inverter of claim 1, wherein
   the input connector has a first gender, and
   the output connector has a second gender complementary to the first gender.

4. The sensor output inverter of claim 3, wherein
   the first gender is female and the second gender is male.

5. The sensor output inverter of claim 1, further comprising:
   a printed circuit board containing the inverting circuit mounted to and electrically connected to the input connector and the output connector.

6. The sensor output inverter of claim 5, wherein:
   at least one of the input connector and the output connector has at least three parallel mounting pins extending therefrom and arranged on a rear side of the input connector so as to form a mounting slot having a slot height;
   the printed circuit board has an edge having a thickness slightly less than the slot height; and
   the printed circuit board is edge-mounted between the at least three mounting pins such that a good mechanical fit is formed between the printed circuit board and the at least three mounting pins.

7. The sensor output inverter of claim 6, wherein:
   the at least three pins of the at least one of the input connector and the output connector are soldered to surface-mount contact pads on the printed circuit board.

8. The sensor output inverter of claim 1, wherein the input connector and the output connector are DIN connectors.

9. The sensor output inverter of claim 8, wherein the DIN connectors are adapted to couple with DIN connectors of the opposite gender to form a water-resistant connection.

10. The sensor output inverter of claim 9, wherein the DIN connectors and the inverting circuit are overmolded so as to make the inverter water-resistant.

11. The sensor output inverter of claim 2, wherein:

the in-line housing has a first end with a first opening opposite an second end with a second opening, the first opening sized to admit one of the input connector and the output connector, the second end further has a perimeter having a reducing beveled lip such that the second opening is smaller than the first opening, and the one of the input connector and output connector has a perimeter having a protruding beveled flange engageable with the reducing beveled lip when the connector is inserted into the housing in a first direction so as to inhibit further movement in the first direction.

12. The sensor output inverter of claim 11, wherein the housing is dimensioned so as to completely covered the inverting circuit and partially cover the input and output connectors.

* * * * *